(12) United States Patent
Wegmann et al.

(10) Patent No.: US 7,333,216 B2
(45) Date of Patent: Feb. 19, 2008

(54) APPARATUS FOR WAVEFRONT DETECTION

(75) Inventors: Ulrich Wegmann, Königsbronn (DE); Helmut Haidner, Aalen (DE); Martin Schriever, Aalen (DE)

(73) Assignee: Carl Zeiss SMT AG, Oberkochen (DE)

( * ) Notice: Subject to any disclaimer, the term of this patent is extended or adjusted under 35 U.S.C. 154(b) by 0 days.

(21) Appl. No.: 09/792,607

(22) Filed: Feb. 23, 2001

(65) Prior Publication Data

US 2002/0001088 A1    Jan. 3, 2002

(30) Foreign Application Priority Data

Feb. 23, 2000    (DE) ................ 100 08 181

(51) Int. Cl.
*G01B 9/00* (2006.01)
(52) U.S. Cl. ..................... 356/521; 356/124
(58) Field of Classification Search ........... 356/124, 356/512, 520, 521, 515
See application file for complete search history.

(56) References Cited

U.S. PATENT DOCUMENTS

| | | | | |
|---|---|---|---|---|
| 3,829,219 A * | 8/1974 | Wyant | ........... | 356/521 |
| 4,246,485 A * | 1/1981 | Bossomaier et al. | ..... | 250/486.1 |
| 4,399,356 A | 8/1983 | Feinleib et al. | ........ | 250/201.9 |
| 4,413,909 A * | 11/1983 | Pohle | ........... | 356/521 |
| 4,518,854 A * | 5/1985 | Hutchin | ........... | 356/521 |
| 4,914,284 A * | 4/1990 | Halldorsson et al. | .... | 250/206.2 |
| 4,953,981 A * | 9/1990 | Hales | ........... | 356/520 |
| 5,357,311 A | 10/1994 | Shiraishi | ........ | 355/53 |
| 5,357,341 A * | 10/1994 | Kuchel et al. | ........ | 356/520 |
| 5,606,417 A * | 2/1997 | Primot et al. | ........ | 356/354 |
| 5,715,039 A | 2/1998 | Fukuda et al. | ........ | 355/53 |
| 5,796,154 A * | 8/1998 | Sano et al. | ......... | 257/432 |
| 5,805,273 A * | 9/1998 | Unno | ........... | 355/53 |
| 5,822,066 A * | 10/1998 | Jeong et al. | ........ | 356/521 |
| 5,978,085 A | 11/1999 | Smith et al. | ........ | 356/354 |
| 6,011,624 A * | 1/2000 | de Groot | ........ | 356/511 |
| 6,111,646 A * | 8/2000 | Naulleau et al. | ........ | 356/494 |
| 6,118,535 A * | 9/2000 | Goldberg et al. | ........ | 356/521 |
| 6,124,974 A * | 9/2000 | Burger | ........... | 359/621 |
| 6,151,115 A * | 11/2000 | Naulleau | ........ | 356/499 |
| 6,304,330 B1 * | 10/2001 | Millerd et al. | ........ | 356/521 |
| 6,307,635 B1 * | 10/2001 | Goldberg | ........ | 356/521 |
| 6,312,373 B1 * | 11/2001 | Ichihara | ........ | 356/515 |
| 7,236,254 B2 | 6/2007 | Kakuchi et al. | | |

FOREIGN PATENT DOCUMENTS

DE    30 20 022    3/1981

(Continued)

OTHER PUBLICATIONS

Patentschrift 0 154 239, 16 pgs., Int. Cl G01B 9/02, Mar. 3, 1982. no translation.

(Continued)

*Primary Examiner*—Chih-Cheng G Kao
(74) *Attorney, Agent, or Firm*—Sughrue Mion, PLLC

(57) ABSTRACT

An apparatus for wavefront detection includes a wavefront source for the production of a wavefront, an optical system transforming the wavefront, a diffraction grating through which the transformed wavefront passes, and a spatially resolving detector following the diffraction grating. The wavefront source has a two-dimensional structure.

47 Claims, 12 Drawing Sheets

FOREIGN PATENT DOCUMENTS

| | | |
|---|---|---|
| DE | 195 38 747 A1 | 4/1997 |
| WO | WO 02/42728 | 5/2002 |

OTHER PUBLICATIONS

DD A 213 057 Patentschrift, Germany, Classes G01M 11/02, dated Aug. 29, 1984 (in German) no translation.

Katsuyuki Omura, et al., "Phase measuring Ronchi test," Applied Optics, pp. 523-528, vol. 27, No. 3, Optical Society of America, Feb. 1988.

M.P. Rimmer, et al., "Evaluation of Large Aberrations Using a Lateral-Shear Interferometer Having Variable Shear," Applied Optics, pp. 142-150, vol. 14, No. 1, Optical Society of America, Jan. 1975.

James E. Pearson, et al., "Adaptive Optical Techniques for Wave-Front Correction," Applied Optics and Optical Engineering, pp. 245-340, vol. VII, Chapter 8, Academic Press, Inc. 1979.

K. Hibino, et al., "Dynamic range of Ronchi test with a phase-shifted sinusoidal grating," Applied Optics, pp. 6178-6189, vol. 36, No. 25, Optical Society of America, Sep. 1997.

Daniel Malacara, "Practical Aspects of the Ronchi Test," Optical Shop Testing (2nd edition), pp. 350-353, Chapter 9.5, John Wiley & Sons, Inc., 1992, United States.

* cited by examiner

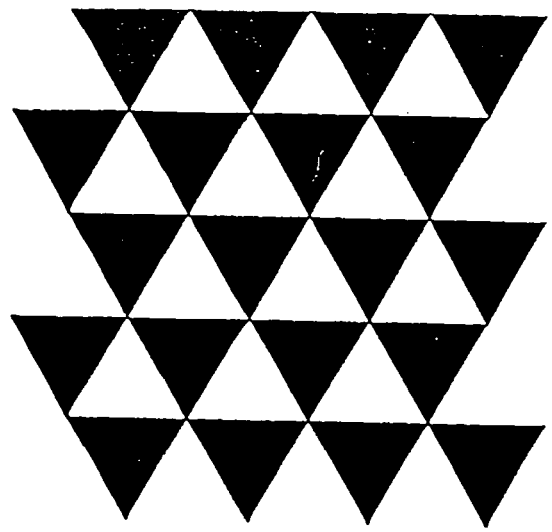
FIG. 10
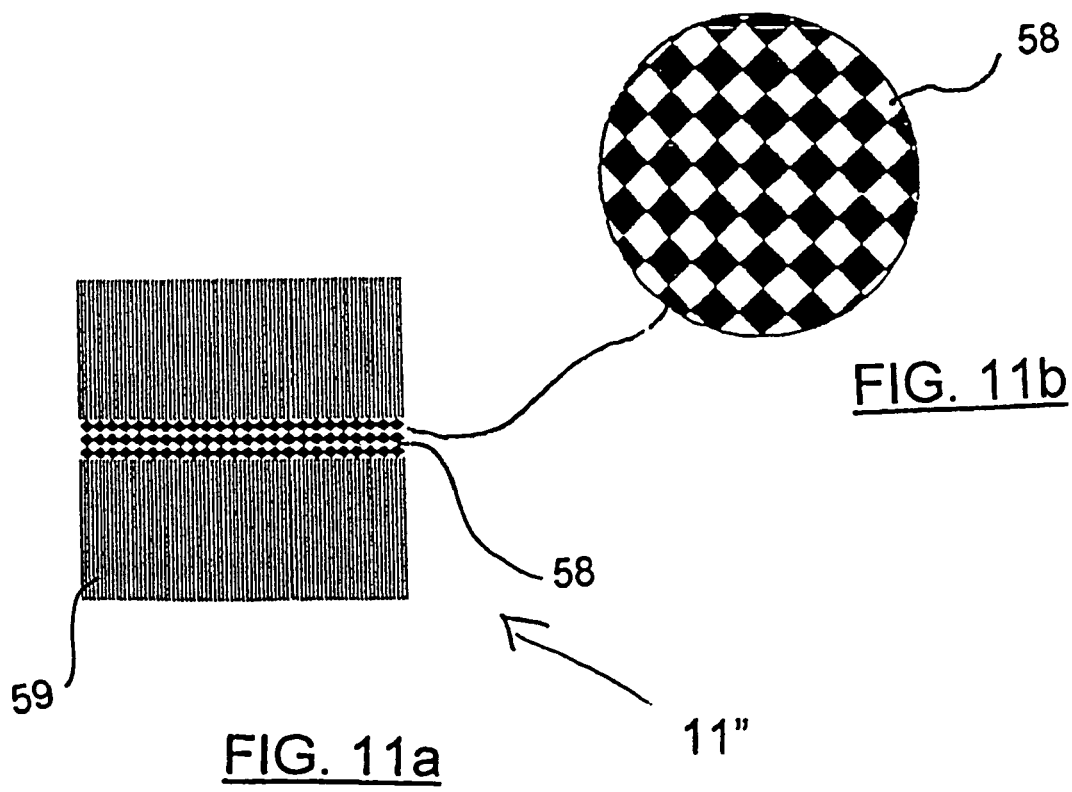
FIG. 11b
FIG. 11a

US 7,333,216 B2

APPARATUS FOR WAVEFRONT DETECTION

CROSS-REFERENCES TO RELATED APPLICATIONS

Not Applicable

STATEMENT REGARDING FEDERALLY SPONSORED RESEARCH OR DEVELOPMENT

Not Applicable

REFERENCE TO A MICROFICHE APPENDIX

Not Applicable

BACKGROUND OF THE INVENTION

1. Field of the Invention

The invention relates to an apparatus for the detection of wavefronts of electromagnetic radiation, in particular visible and ultraviolet light and soft X-rays, and also to a process for wavefront detection, and a stepper or scanner for microlithography with such an apparatus of the concerned category, for wavefront detection.

2. Technical Field

An apparatus of the concerned category, for wavefront detection, is known from "Phase Measuring Ronchi Test", by Katsuyuki Omura et al. (pages 523-528 in APPLIED OPTICS, Vol. 27, No. 3, February 1988). In this known apparatus, which is used for testing the imaging quality of a test lens, a monochromatic point light source of a He—Ne laser produces a wavefront, which passes through a collimator and a test lens and thereafter strikes a diffraction grating known as a Ronchi grating. The collimator transforms the wavefront emerging from the point light source into a plane wave striking the test lens, the diffraction grating being situated in the image-side focal plane of the test lens. The diffraction pattern or interferogram produced by the Ronchi grating is recorded by a spatially resolving detector including a TV camera, and is used thereon for the detection of the wavefront leaving the optical system.

DD 0154 239 also discloses an apparatus for wavefront detection of the concerned category termed a shearing interferometer, for the interferometric testing of objectives. In this apparatus for wavefront detection, the diffraction grating is situated outside the focal plane of the objective being tested.

In DE 195 38 747 A1, a grating shear interferometer for wavefront detection of the concerned category is described, in which the light of a plane wave to be investigated falls on two phase gratings, one behind the other, and is then sensed by a CCD camera for wavefront analysis.

A further apparatus for wavefront detection according to the preamble of claim 1 is known from the article "Evaluation of Large Aberrations Using a Lateral-Shear Interferometer Having Variable Shear" by M. P. Rimmer et al., in APPLIED OPTICS, Vol. 14, No. 1, January 1975, pages 142-150. The optical system connected between the wavefront source and the diffraction grating is a curved mirror in this case.

J. E. Pearson et al., in APPLIED OPTICS AND OPTICAL ENGINEERING, Vol. VII, Academic Press, Inc., 1979, Chapter 8, "Adaptive Optical Techniques for Wave-Front Correction", referred to adaptive optics with hearing interferometers as wavefront detectors and to photolithography as a possible field of application for them.

The article "Dynamic range of Ronchi test with a phase-shifted sinusoidal grating" by K. Hibino et al. in APPLIED OPTICS, Vol. 36, No. 25, September 1997, pages 6178-6189, describes an apparatus for wavefront detection of the concerned category, in which a test lens transforms a monochromatic plane wave and deflects it onto a diffraction grating formed as a sine transmission grating. The wavefronts diffracted by the diffraction grating are collimated by an imaging lens and form, on a rotating matt disk arranged in the focal plane of the imaging lens, a shear interferogram which is recorded by a CCD detector and is then used for testing the test lens.

SUMMARY OF THE INVENTION

The invention has as its object to provide an improved apparatus of the concerned category for wavefront detection. This object is attained by a wavefront source for production of a wavefront, a diffraction grating following the wavefront source, and a spatially resolving detector following the diffraction grating, wherein the wavefront source has a two-dimensional structure. The spatial coherence of the radiation can then be adjusted by means of the two-dimensional structure of the wavefront source such that the wavefronts transformed by the optical system can be measured with high accuracy.

This can take place, according to the invention, with the operating light source at the operating wavelength of the optical system. The apparatus for wavefront detection according to the invention is suitable for both coherent and incoherent radiation from the infrared as far as the X-ray region. A large spectral region is already accessible by the use of conventional CCD camera technique for the spatially resolving detector. At extremely short wavelengths, for example, a photoemission electron microscope (PEEM) can also be used as the spatially resolving detector. The spatially resolving detector may also comprise a sensor constructed with CMOS technique which is characterized by low power consumption and allows the integration of a digital-analog converter into the detector. A sensor using the CID (Charge Injection Device) technique is also possible.

Departing from the cited state of the art, according to the invention it is not required to irradiate the optical system to be tested with a plane wave, e.g., by arranging a collimator before it.

For very short wavelengths extending into the X-ray region, it can be advantageous to construct the wavefront source as a reflecting element, e.g., as a reflection mask.

In an advantageous embodiment, the wavefront source includes a perforated mask, whence the two-dimensional structure of the wavefront source has high contrast. Such a perforated mask can in particular have plural openings arranged in fourfold or threefold symmetry.

The perforated mask can then be arranged between an exit surface of a light guide and the optical system. In particular, a compact wavefront source of high luminance is obtained when the perforated mask is connected to the light guide.

When the perforated mask is situated in an object plane and the diffraction grating is situated in an image plane conjugate to the object plane, the wave front can be measured with finite-finite imaging of the optical system, while maintaining the exact distance between conjugate points of the optical system. The quality of an optical system can thus be tested in its specific field of use. Since this is possible without inserting additional components, for example collimator lenses, into the beam path of the optical system between the object and the image, the invention enables the calibration of such additional components to be dispensed with.

In a further advantageous embodiment, a displacement module is associated with a light guide—perforated mask combination, and displaces the perforated mask together with the exit surface of the light guide in the object plane. The imaging quality of the optical system for a large imaging field can be measured by means of the displacement of the wavefront source which is possible in this manner.

The light guide can be a multimode light guide, in order to also be able to test the imaging quality of the optical system when using white light, that is, a mixture of wavelengths, or multimode lasers of short coherence length (a few tens of ìm). "Light guide" is of course intended to mean a radiation guide which is suitable over the visible region of the electromagnetic radiation and beyond.

In an advantageous embodiment, the diffraction grating is constituted in dependence on the structure of the wavefront source such that only given diffraction orders contribute to the interference at the diffraction grating.

Independently of this, the diffraction grating can be a phase grating or an amplitude grating, or any other suitable type of diffraction grating, e.g., a gray value grating produced by dithering or else a reflecting grating, which is of particular use for very short wavelengths.

According to another embodiment, the diffraction grating has a respective diffracting periodic structure for different directions. Phase gradients in more than one direction can thereby be determined from a single interferogram recorded by the spatially resolving detector.

It is then of particular advantage when these directions are mutually orthogonal, e.g., as in a diffraction grating constituted as a chessboard grating or cross grating: because the shearing caused by the grating, in the sense of the theory of the lateral shearing interferometer, is thereby produced simultaneously in the X and Y directions.

The diffraction grating can also have periodicity directions including angles of, e.g., 45°, 60°, or 120°. In a diffraction grating constituted as a triangle grating with periodicity directions respectively pairwise including an angle of 120°, or a triangle grating with 45° and 90°, i.e., with equilateral and right-angled triangles, more than two periodicity or displacement directions result. The redundancy resulting therefrom can be used for increasing the measurement accuracy by compensating calculation.

Such diffraction gratings with several periodicity directions, e.g., a sine grating periodic in the X and Y directions, can be suitably embodied as phase gratings in view of suppression of undesired diffraction orders and of their production.

In order to be able to test an optical system as accurately as possible in its operating distance between conjugate points, it is desirable to adjust the diffraction grating as accurately as possible in the image plane conjugate to the object plane. For this purpose, the diffraction grating includes a grating having a respective diffracting periodic structure in different periodicity directions, and a line grating coplanar with this, e.g., a line grating arranged in the plane of the diffraction grating and connected to the diffraction grating. This is because, in combination with a further line grating in the object plane and having its grating constants matched to the imaging scale of the optical system and to the grating constants of the line grating connected to the diffraction grating, a moire pattern arises at a suitable orientation of the line grating. The best setting plane for the diffraction grating is then characterized by the maximum moire contrast.

In view of the evaluation of the interferogram, it is advantageous for a translation module to be associated with the diffraction grating, for displacement of the diffraction grating in the two mutually orthogonal directions. The contrast of one of the orthogonal interference systems can then be suppressed by means of a movement of the diffraction grating by an integral multiple of the respective grating period.

However, the diffraction grating can also be a line diffraction grating, a rotation module then being advantageously associated with the diffraction grating for rotating the diffraction grating through 90° in order to be able to detect both orthogonal interference systems for a complete wavefront reconstruction.

The detector can be suitably matched to the interferogram by means of an imaging system arranged between the diffraction grating and the detector. It is then advantageous for the displacement module associated with the light guide to also displace the imaging system parallel to the image plane when the exit surface of the light guide is displaced.

With a correction of such an imaging system to the Abbe sine condition, the lateral shearing of the wavefronts caused by the diffraction grating is transmitted to the detector, constant for all aperture angles.

With a first beamsplitter arranged between a radiation source and the wavefront source to couple-out a portion of the radiation supplying the wavefront source, and a second beamsplitter which deflects the portion of radiation coupled-out by the first beamsplitter to the detector, bypassing the optical system and diffraction grating, the constancy of the radiation source or wavefront source can be monitored. A reference light guide can then transport the radiation fraction coupled-out by the first beamsplitter to the second beamsplitter. A portion of the illuminating radiation can also be deflected to the deflector past the diffraction grating, e.g. through a recess of the diffraction grating.

According to a further viewpoint of the invention, the basic object is attained by a diffraction grating through which a wavefront passes, and a spatially resolving detector following the diffraction grating, wherein the detector is curved at least regionally toward the diffraction grating. A detector which is curved toward the diffraction grating can detect the interferogram produced by the diffraction grating in a manner which is advantageous for the subsequent use of the interferogram.

Thus with a regionally spherical detector the lateral shearing, produced by the diffraction grating, of the wavefronts can be transferred, constant or undistorted, to the detector independently of the diffraction angle. This gives a considerably simplified reconstruction of the wavefront topography from the shear interferograms.

This can be understood from the fact that the shear interferogram depends on the phase displacement between the diffracted wavefront and the undiffracted wavefront, and this phase displacement is constant on a spherical surface concentric with the origin of the undiffracted wavefront.

When the detector includes an at least regionally spherical secondary radiating surface arranged between the diffraction grating and the radiation-sensitive sensor surface, conventional image sensors with a planar radiation-sensitive surface, for example, TV cameras, CCD sensors, PEEM, and the like, can be used for an apparatus according to the invention. Suitable secondary radiating surfaces can for example be constituted as a ground glass screen or as a fluorescent layer.

By means of a suitable frequency-converting secondary radiating surface, for example, a fluorescent layer, the detector itself can be adjusted to the respective measurement wavelength within a large wavelength range, with the use of commercially available radiation sensitive sensor surfaces which are optimized for the visible wavelength region.

In a further embodiment, the detector includes on the diffraction grating side a number of light guides, the ends of whose light guides on the diffraction grating side are arranged on a spherical shell. This can be effected, for example, by polishing a concave spherical surface in the end of an imaging optical fiber bundle or in an optical fiber plate.

The plural light guides arranged between the diffraction grating and the detector can, as an image-preserving optical fiber bundle, transport the interferogram to a relatively freely positionable sensor surface. The diffraction grating can thereby be arranged within a vacuum, for example, and an image sensor acting as a heat source, for example a TV camera, outside the vacuum.

With a view to a reliable detection of the shear interferogram, the light guide ends remote from the diffraction grating can be directly associated with the radiation-sensitive sensor surface. For example, the fiber bundle end can be placed in direct contact with a camera chip.

The detector can also include a preferably telecentric imaging optical system. Imaging of the interferogram onto the radiation-sensitive surface in a manner suited to the dimensions of the sensor surface is thereby possible.

According to a further viewpoint of the invention, the basic object is attained by a diffraction grating holder that holds the diffraction grating and has a secondary radiator source. With a grating holder having both the diffraction grating and also a secondary radiator surface, the apparatus for wavefront detection can thereby be particularly compact. It is thereby possible to integrate an apparatus for wavefront detection according to the invention into already existing optical imaging devices, for operational monitoring of the imaging quality.

Particularly advantageous is a hemisphere which is arranged between the diffraction grating and the radiation-sensitive sensor surface and supports the diffraction grating on its planar surface. The already mentioned advantages of spherical sensor surfaces can thereby be attained in a compact and robust constructional form. The spherical surface region of the hemisphere is then preferably constituted as the secondary radiator surface.

This hemispherical embodiment of the diffraction grating holder can be combined, in a manner which is efficient as regards production technology, with an optical fiber bundle and a secondary radiating surface if the optical fiber bundle ends on the diffraction grating side are connected to the spherical surface region of the hemisphere with a frequency-converting cement.

In a further embodiment, a wavefront module is arranged in front of the diffraction grating, and an optical system is arranged between the wavefront module and the diffraction grating. The optical system can thereby be investigated with high accuracy, with a diffraction grating and detector unit adjusted to the wavefront module.

With plural wavefront sources in the wavefront module, the optical system can be investigated with respect to its object field at plural field points simultaneously, i.e., in parallel. A considerable reduction of the time required for the investigation of an optical system is possible by means of such a simultaneous measurement of the wavefronts at many field points.

When each wavefront source has a perforated mask, the structure of the wavefront sources can be adjusted to the imaging scale of the optical system and the diffraction grating such that only given diffraction orders contribute to the interference at the diffraction grating, whereby the evaluation of the interferogram becomes particularly efficient. Furthermore, a perforated mask gives high contrast to the two-dimensional structure of the wavefront source. With a view to a highly accurate wavefront analysis, the perforated mask can have plural openings.

In an embodiment, a refractive or diffractive focusing optics is associated with each wavefront source and concentrates incident illuminating light onto the wavefront source. A standard illuminating device of the optical system, usually illuminating a relatively large object field, can be used for the wavefront module in this manner.

Plural light guides are advantageously associated with each wavefront source. The interferograms of the individual wavefront sources can thereby be satisfactorily imaged on a respectively allocated region of the radiation-sensitive sensor surface.

The association of a spherical secondary radiator surface with each wavefront source makes possible undistorted detection by the detector of the lateral shearing produced by the diffraction grating.

The apparatus according to the invention is particularly suitable, because of its compactness and evaluation efficiency and accuracy, for the testing of projection objectives for microlithography.

The invention also relates to a process for wavefront detection comprising the steps of producing a wavefront by a wavefront source, producing an interferogram with the wavefront and with a diffraction grating having a diffracting periodic structure respectively in different periodicity directions, recording an image of the interferogram with a radiation-sensitive detector, and displacing the wavefront source or the diffraction grating in one periodicity direction by an integral multiple of a corresponding grating period. The contrast of one of the orthogonal interference systems can be suppressed, and the evaluation of the interferogram considerably simplified, by the displacement of the wavefront source or of the diffraction grating in one of its periodicity directions by an integral multiple of the corresponding grating period.

The displacement of the wavefront source or of the diffraction grating can then take place during the image recording time of the detector, typically 30 milliseconds. The displacement path of the diffraction grating is then typically 6-18 µm.

However, with a very fast detector, plural interferogram images can also be recorded during the displacement of the wavefront source or of the diffraction grating, the plural interferogram images then being used for wavefront detection. A superposition of the individual interferogram images then again corresponds to the abovementioned image integration during the complete diffraction grating displacement.

The phase modulation by a reciprocating motion of the diffraction grating with a frequency $\omega$ and by adjoining narrow-band filters, known, for example, from DE 195 38 747 A1, can be further superposed on this displacement, according to the invention, of the diffraction grating in one of its periodicity directions by an integral multiple of the corresponding grating period.

The invention furthermore also relates to a process comprising the steps of producing a wavefront by a wavefront source, producing an interferogram with the wavefront and with a diffraction grating having a diffracting periodic structure respectively in different periodicity directions, and displacing the wavefront source or the diffraction grating by a fraction of the corresponding grating period, and detecting the resulting interferogram, repeating the displacement step, and averaging the interferograms detected in the individual displacement steps for the wavefront detection. The displacing step comprises displacing the wavefront source or the diffraction grating in a direction defined by vectorial superposition of the different periodicity directions. The total amount of displacement of the wavefront source or the diffraction grating is smaller than or equal to half of the corresponding grating period. This aspect of the invention is based on the following problem.

According to experience, interfering signals are superposed on the desired signal in the interferogram. These interfering signals can originate from production errors or imperfections of the diffraction grating or of the wavefront source, per se from the smallest maladjustments of the components, from an imperfect illumination of the wavefront source, or from ghost images or ghost interferograms due to possible back-reflections from the optical system and from the apparatus for wavefront detection (e.g., from the detector surface, grating back side, etc.). These interferences are typically periodically superposed on the desired signal, i.e., they vary periodically around the correct measurement value. Their frequency, phase position and amplitude can be detected by variation of the initial phase (phase position of the grating relative to the wavefront source).

In particular, with a variation of the phase position of the wavefront source, e.g., by displacement of the illumination mask with respect to the stationary diffraction grating, distinct amplitudes, i.e. large changes of the interfering signals, then appear.

Since such interferences vary periodically around the average value, they can be eliminated by computer, by displacement of the position of the wavefront source or of the diffraction grating by defined fractions of the respective period and subsequent averaging of the measurement values.

The Applicant has found in this connection that the interference signals have a dominant contribution to the second harmonic of the desired signal, and thus run through two oscillation periods when the initial phase is varied by a period of the grating or of the wavefront source.

The invention furthermore relates to a stepper or scanner for microlithography, with an apparatus for wavefront detection described herein-above.

Such a stepper/scanner can be monitored in situ, i.e., at the place of production and during the production cycle, without great disturbance of the course of production, for its production quality, for example, for the adherence to tolerance limits for the respective image errors, if the wavefront module can be brought operationally into the object plane of the projection objective and removed from it and/or when the diffraction grating can be brought operationally into the object plane of the projection objective and removed from it.

It is particularly favorable when the stepper/scanner has an aberration control circuit, which can act on the projection objective by means of active or manipulator elements.

A particular suitability of the apparatus for wavefront detection according to the invention in a stepper or scanner for microlithography is also based on the fact that it is suitable for both coherent and also incoherent radiation, from the infrared as far as the X-ray region, and also particularly for radiation sources of short coherence length such as a HBO lamp, an excimer laser or a synchrotron radiator. Production monitoring can also take place with the operating light source at the operating wavelength of the microlithography projection objective.

BRIEF DESCRIPTION OF DRAWINGS

The invention is described hereinafter using embodiment examples in connection with the accompanying schematic drawings.

FIG. 10 is a diagram showing a third diffraction grating usable for the apparatus of FIG. 1;

FIG. 11 is a diagram showing a fourth diffraction grating usable for the apparatus of FIG. 1;

DETAILED DESCRIPTION OF PREFERRED OF EMBODIMENTS

Figure 1:
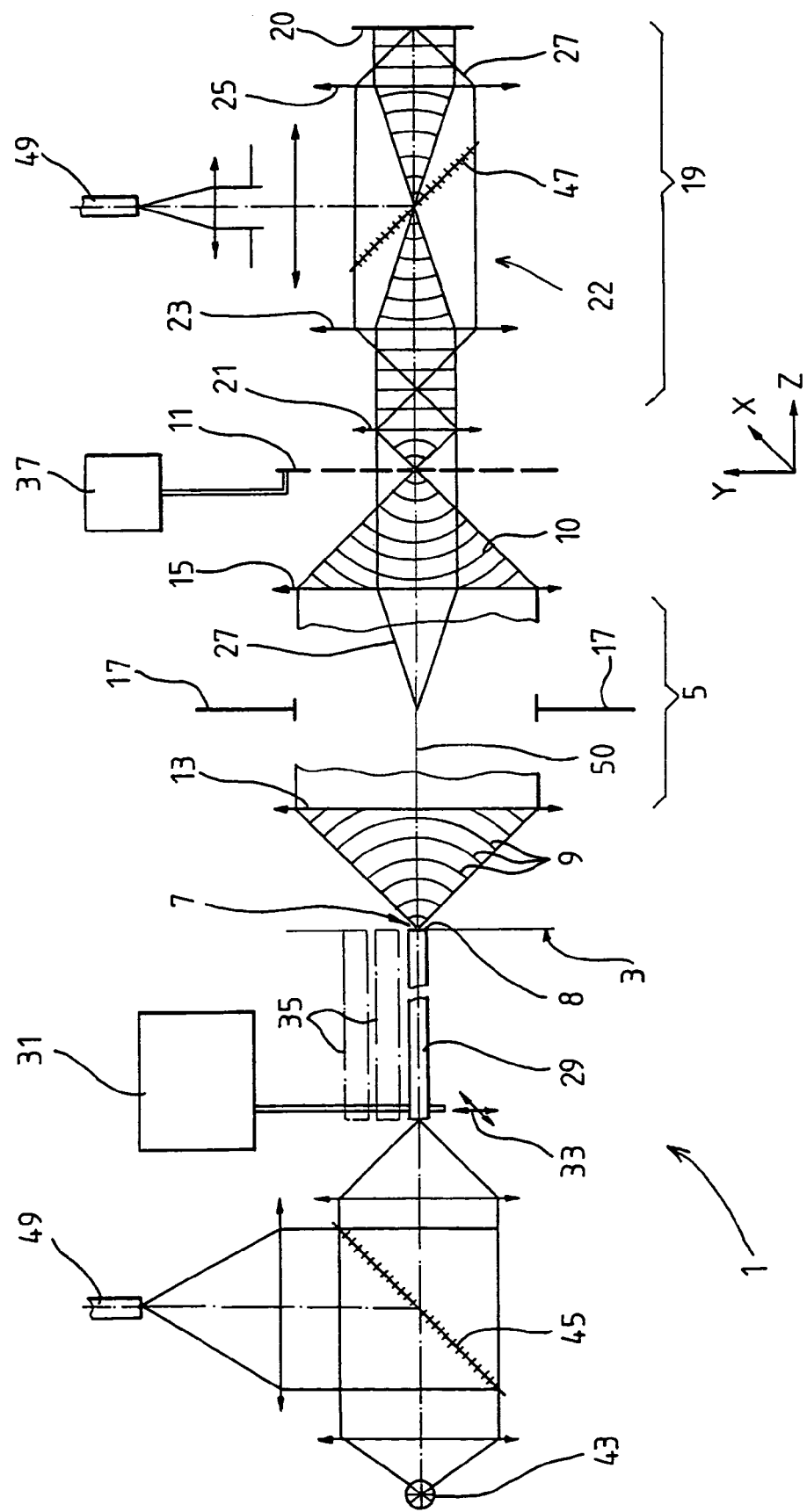
FIG. 1 is a diagram showing an embodiment of the apparatus for wavefront detection according to the invention.

An apparatus 1 for wavefront detection is shown schematically in a longitudinal section in FIG. 1. A wavefront source 7 arranged in an object plane 3 of an optical system 5 produces a wavefront. The wavefronts 9, shown schematically as contour lines, emergent from the wavefront source 7 pass through the optical system 5 and are formed by the optical system 5 into emergent wavefronts 10 which then strike a diffraction grating 11.

The optical system 5, whose optical axis 50 is parallel to a Z direction, includes two optical elements symbolized by double arrows, e.g., lenses 13 and 15, and images the wavefront source 7 on the diffraction grating 11, the diffraction grating 11 being situated in the image plane conjugate to the object plane 3. An aperture stop 17 of the optical system 5 can likewise be Recognized in FIG. 1.

A spatially resolving detector 19 follows the diffraction grating 11. The detector 19 includes a radiation-sensitive sensor surface 20, e.g., a CCD chip, and also an imaging system 22 arranged between the diffraction grating 11 and the sensor surface 20 and imaging on the sensor surface 20 the interferogram or shearing diagram produced by the diffraction grating 11. The imaging system 22 has a microscope objective 21 and further optical elements 23 and 25 and, together with the optical element 15, images the aperture stop 17 onto the sensor surface 20, as shown by the pupil beam path 27. The imaging system 22 is sine corrected, the quality of the sine correction of the microscope objective 21 being decisive for the constancy of the shear distance over the measured wavefront.

Figure 2:
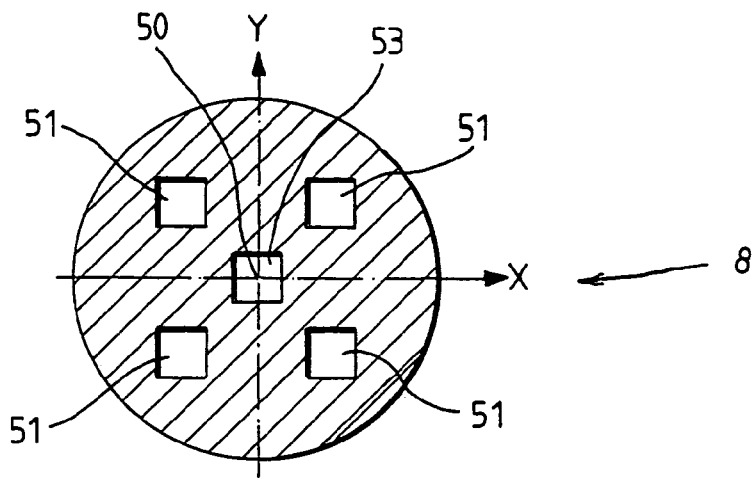
FIG. 2 is a plan view of the illumination mask of the wavefront source of FIG. 1.

The wavefront source 7 includes a perforated mask 8, shown in detail in FIG. 2, installed at the output of a light guide 29. For the investigation of the whole image field of the optical system, the light guide 29 is displaceable parallel to the object plane 3 in the X and/or Y direction by means of a displacement module 31, as illustrated by the double arrow 33 and the dash-dot phantom diagrams 35.

In the apparatus 1, the detector 19 is also moved by the displacement module 31 in the X and/or Y direction simultaneously with the light guide 29, for scanning the image field of the optical system 5.

The diffraction grating 11 can be displaced by a translation module 37 in the image field of the optical system 5, i.e. in the X direction and/or Y direction, in order to be able to suppress the contrast of one of the orthogonal interference systems of the diffraction grating 11.

A first beamsplitter 45 is arranged between a radiation source 43 and the wavefront source 7, for coupling-out a portion of the radiation supplying the wavefront source. A second beamsplitter 47 arranged between the optical elements 23 and 25 in a focal point of the wavefront deflects the portion of radiation coupled-out by the first beamsplitter 45, by-passing the optical system 5 and diffraction grating 11, to the sensor surface 20, whereby the constancy of the radiation source 43 can be monitored. A reference light guide 49 conveys the radiation portion coupled-out by the first beamsplitter 45 to the second beamsplitter 47.

As can be seen in FIG. 2, the perforated mask 8 of the wavefront source 7 has a square opening 53 arranged centered on the optical axis 50 of the optical system 5, and four openings 51 arranged around and spaced from the opening 53 and symmetrically with respect to the optical axis 50.

Figure 3:
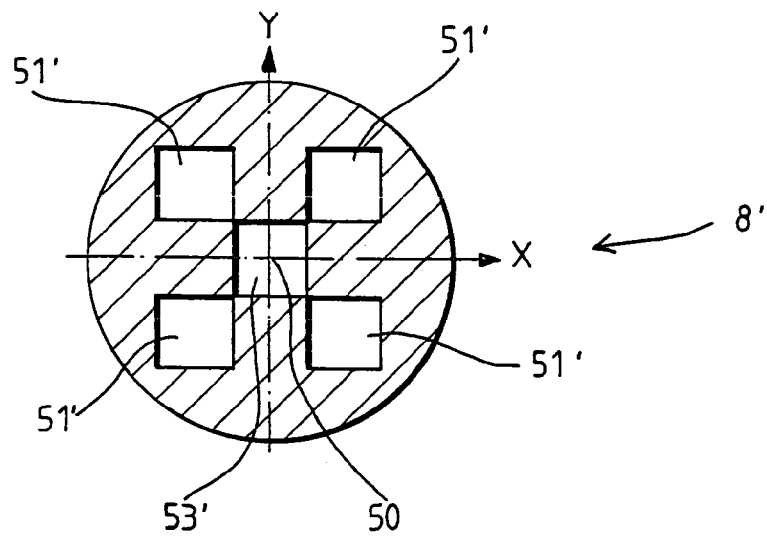
FIG. 3 is a plan view of an alternative illumination mask.

A further embodiment of a perforated mask suitable for the wavefront source 7 is shown in FIG. 3. This perforated mask 8' includes a square opening 53' likewise arranged centered on the optical axis 50 of the optical system 5 and four openings 51' arranged adjoining the opening 53' and symmetrically around the optical axis 50.

The number of openings of a perforated mask according to the invention can also be greater than in FIGS. 2 and 3, according to the case of application.

Figure 8:
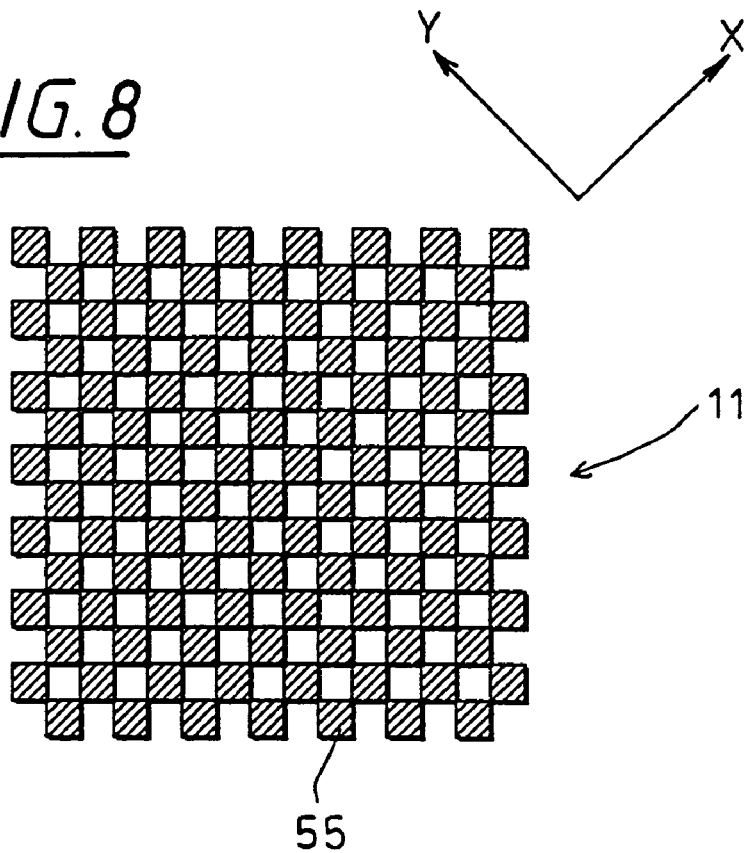
FIG. 8 is a plan view showing the diffraction grating of the apparatus of FIG. 1.
Figure 9:
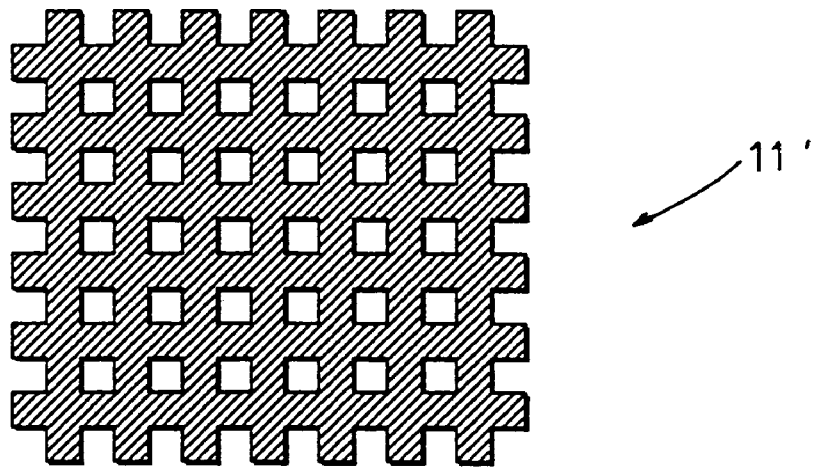
FIG. 9 is a diagram showing a second diffraction grating usable for the apparatus of FIG. 1.

These two-dimensional structures of the wavefront source 7 are matched to the diffraction grating shown in FIGS. 8 and 9 such that only given orders of diffraction contribute to the interference at the diffraction grating.

Figure 4:
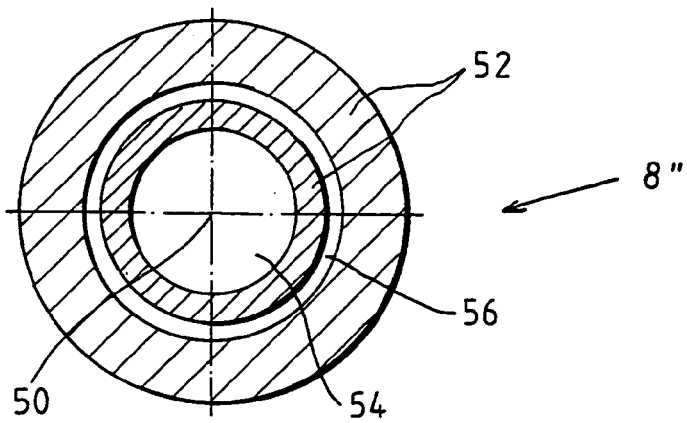
FIG. 4 is a diagram showing a further illumination mask, suitable for the wavefront source of FIG. 1.

A perforated mask 8" with rotationally symmetrical transmission distribution is shown in FIG. 4; in it, a central circular surface 54 and also an annular surface 56 are transparent, and complementary annular surfaces 52 are opaque.

Figure 5:
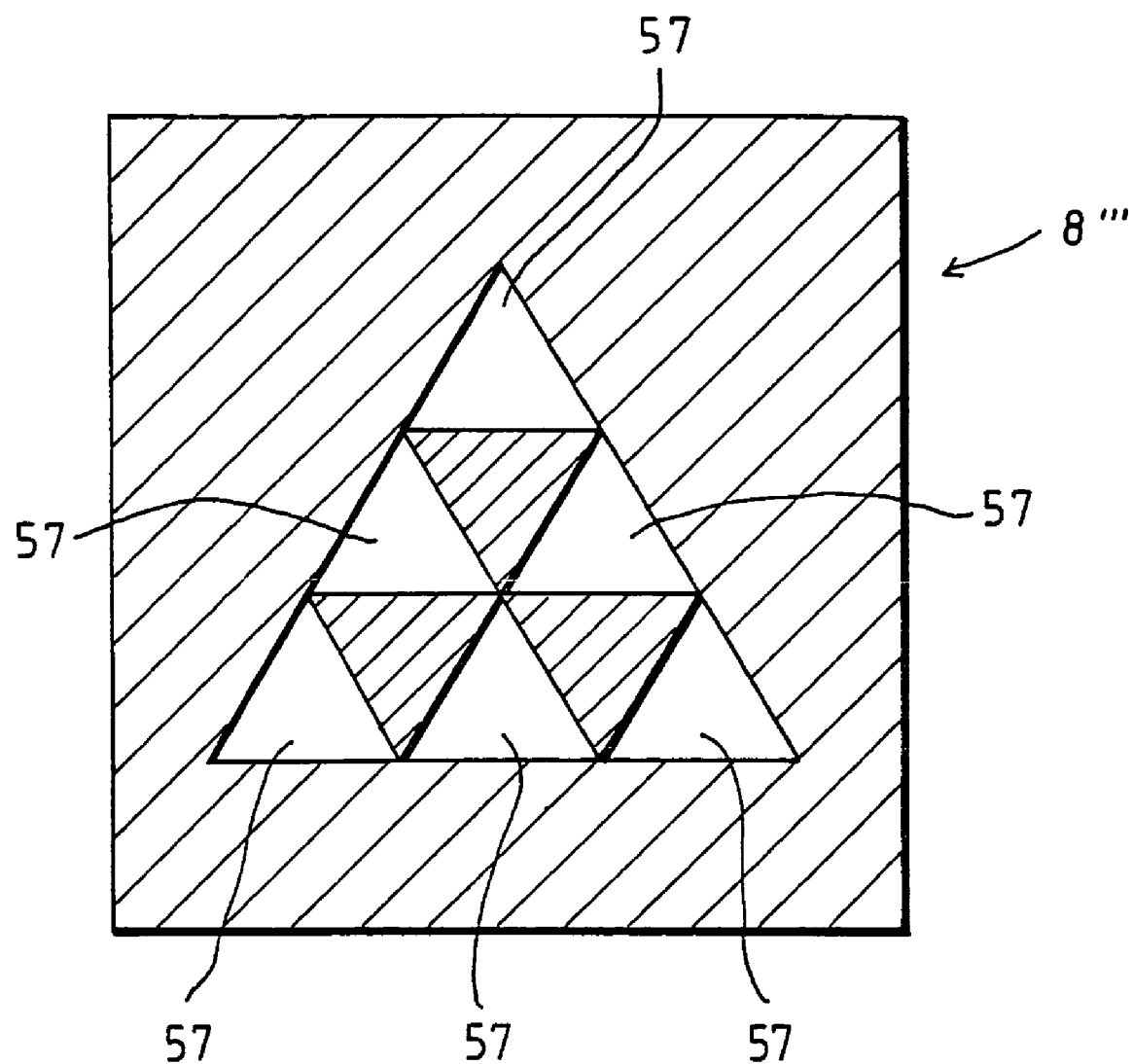
FIG. 5 is a diagram showing yet another illumination mask, suitable for the wavefront source of FIG. 1.

An illumination mask 8''' with openings 57 is shown in FIG. 5, and is constituted as equilateral triangles. The illumination mask 8''' thus has a triangular symmetry and cooperates particularly advantageously with the diffraction grating of FIG. 10.

Figure 6:
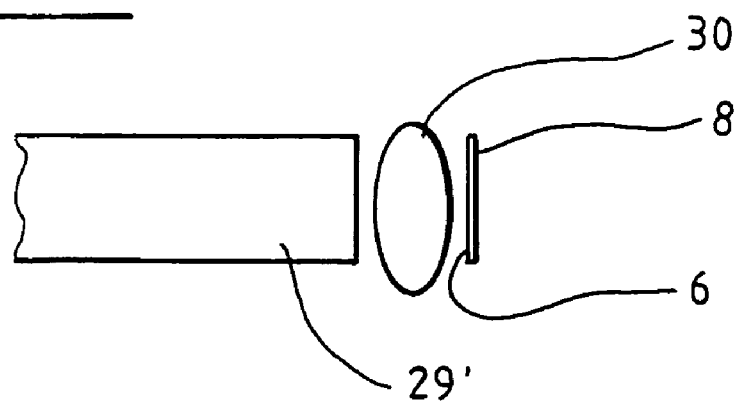
FIG. 6 is a diagram showing an embodiment of the illumination system and illumination mask.
Figure 7:
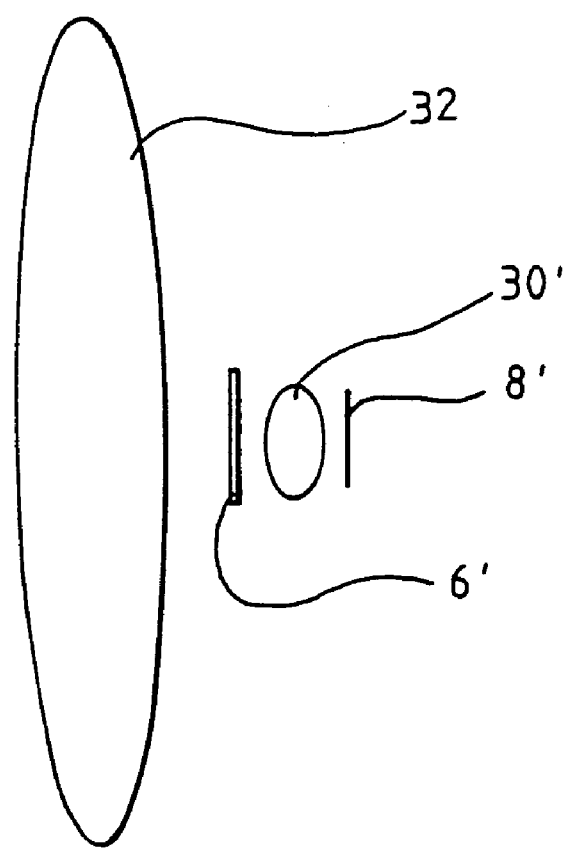
FIG. 7 is a diagram showing a further embodiment of the illumination system and illumination mask.

FIGS. 6 and 7 show alternative embodiments of arrangements of illumination system and illumination masks.

FIG. 6 shows an expanding or focusing lens 30 arranged between a light guide fiber 29' and a perforated mask 8 installed on a matt disk 6.

Spatial coherence can be controlled by means of the matt disk 6; attention has to be paid to the illumination of the perforated mask 8 ideally being incoherent, in order to be able to form in a targeted manner the spatial coherence distribution due to the perforated mask geometry.

The illumination aperture can be matched to the aperture stop 17 by means of the lens 30. The aperture stop can thereby be completely illuminated, i.e., an insufficient filling of the aperture stop 17 can be avoided, even if the numerical aperture of the illumination fiber 29' and of the optical system do not mutually correspond.

A perforated mask 8' illuminated by means of a condenser lens 32, with a matt disk 6' and expanding or focusing lens 30' arranged between them, is shown in FIG. 7.

In another embodiment (FIG. 7a) a microlens system 30'' is provided in place of the expanding or focusing lens 30'. The microlens system may comprise one or more microlens plates. The microlens system may comprise a stack of two or more transparent plates 31'' which are disposed successively when viewed in the radiation direction. The plates may be manufactured from fused silica or calcium fluoride and one or more refractive or diffractive microlenses 32'' may be formed on a plate e.g. by a lithographic manufacturing process. The microlens system shown in FIG. 7a comprises two immediately adjacent lens plates 31'' and is incorporated in a stack or optical elements, wherein the stack comprises a plane-parallel plate 34'' with a matt disk or focusing disk 6'' on the entrance side thereof and a plane-parallel plate 35'' with a mask 8'' on the exit side of the radiation. Microlens systems or optical systems of this kind constructed with plates can be manufactured at low cost and are compact in size. The microlenses are easily adjustable by adjusting the plates relative to each other. A parallel arrangement of lenses or lens systems is preferred, e.g. by providing a one-dimensional or two-dimensional array of microlenses or optics comprising several microlenses, wherein the array is preferably regular. In this way, an apparatus for the detection of wavefronts with high quality and a multitude of channels can be realized at low cost.

In certain embodiments the illumination system of the wavefront source comprises at least one correction device 40'' for correcting the intensity distribution of an illumination channel. The effect of the correcting device may be variably adjustable e.g. by exchanging filter elements. The correction of the intensity distribution, which is preferably introduced in the region or a pupil plane of the illumination system,may be suitably adapted to the detection characteristics of the detector in such a way that the full dynamics of the detector may be exploited. For example, with a detector having a planar sensor surface, e.g. a CCD chip, the area specific illumination intensity may decrease in the peripheral regions of the illuminated area due to oblique incidence of light. This can be compensated by correcting the intensity on the illumination side, wherein a lower illumination intensity is created in a central region as compared to a peripheral region of the illuminated area.

Figure 7A:
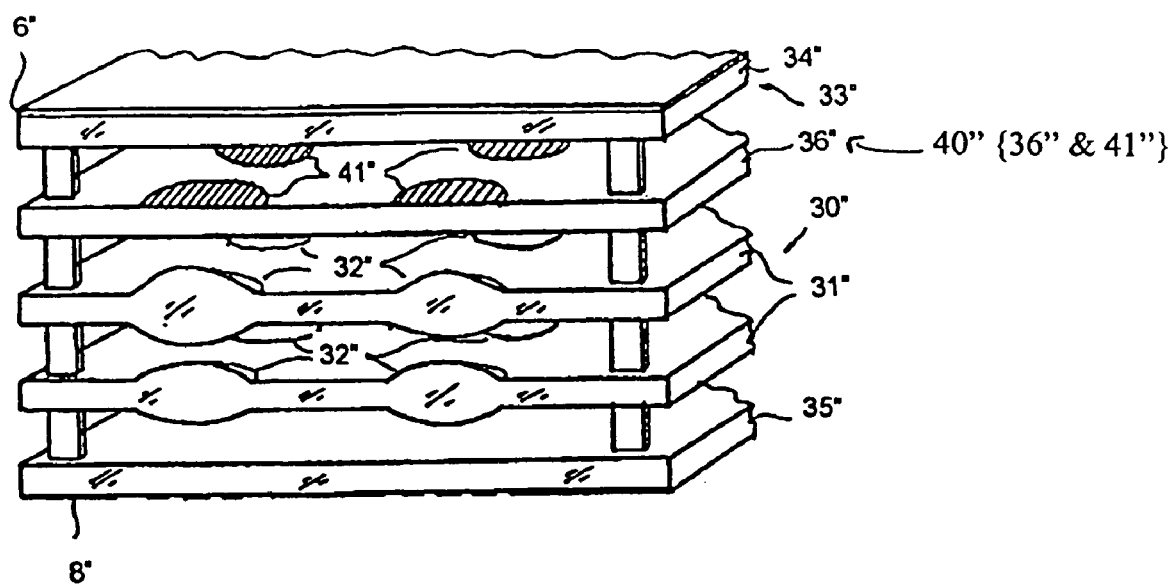
FIG. 7a is a diagram showing another embodiment of the illumination system and illumination mask comprising a stack of microlens plates and integrated gray filters for correcting the spatial intensity distribution.
Figure 7B:
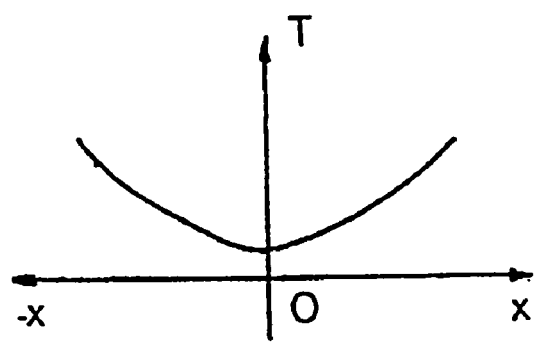
FIG. 7b is a schematic diagram of the transmission of the gray filter shown in FIG. 7a as a function of the radial distance from the central axis of the gray filter.

In the embodiment shown in FIG. 7a the correcting device 40" for correcting the intensity distribution comprises for each channel of the multilens microlens optics of the two-dimensional illumination array constructed in a quadratic array a gray filter 41" having a rotational symmetric transmission characteristics with a transmission T increasing towards the periphery, as schematically shown in FIG. 7b. The gray filters 41" are formed on a plane-parallel filter plate 36", which is disposed between the matt plate 34" and the imaging microlens system 30" The gray filters are disposed in the area of the pupil plane 33" of the illumination system. Alternatively or additionally gray filters may also be disposed at the matt disk 6" or the matt plate 34" or in another pupil plane of the illumination system, if such pupil plane exists. An intensity correction of this type using gray filters can also be provided with one-channel illumination systems, e.g. in the system shown in FIG. 7, where a gray filter may be formed e.g. at the matt disk 6". The term "gray filter" in the sense of this application encompasses all devices effecting the spatial intensity in distribution and using diffraction, refraction, absorption or reflexion.

The diffraction grating 11 is shown in FIG. 8. The diffraction grating 11 includes a chessboard grating 55, which effects interference, i.e. the lateral shearing of the wavefronts. The X and Y directions shown in FIG. 8 correspond to those of FIGS. 1-3, and are to indicate that the chessboard grating 55 is arranged in the apparatus diagonally, in correspondence with the openings 51 and 53, or 51' and 53', of the masks 8 and 8'.

FIG. 9 shows a further embodiment of a diffraction grating 11' suitable for the apparatus of FIG. 1, which is an amplitude grating constituted as a cross grating 11'.

A further embodiment of a diffraction grating 11'" suitable for the apparatus of FIG. 1 is shown in FIG. 10, and cooperates particularly advantageously with the illumination mask 8'" of FIG. 5. The diffraction grating 11'" is an amplitude grating constituted as a triangle grating, and has three directions of diffraction.

FIGS. 11a and 11b show a further advantageous diffraction grating 11". The diffraction grating 11" includes a chessboard grating 58 which is shown enlarged in FIG. 11b and effects interference, i.e., lateral shearing of the wavefronts. A moiré line grating 59 connected to the chessboard grating 58 is arranged in the plane of the chessboard grating 58 in a region not required for the shearing of the wavefront.

Figure 12:
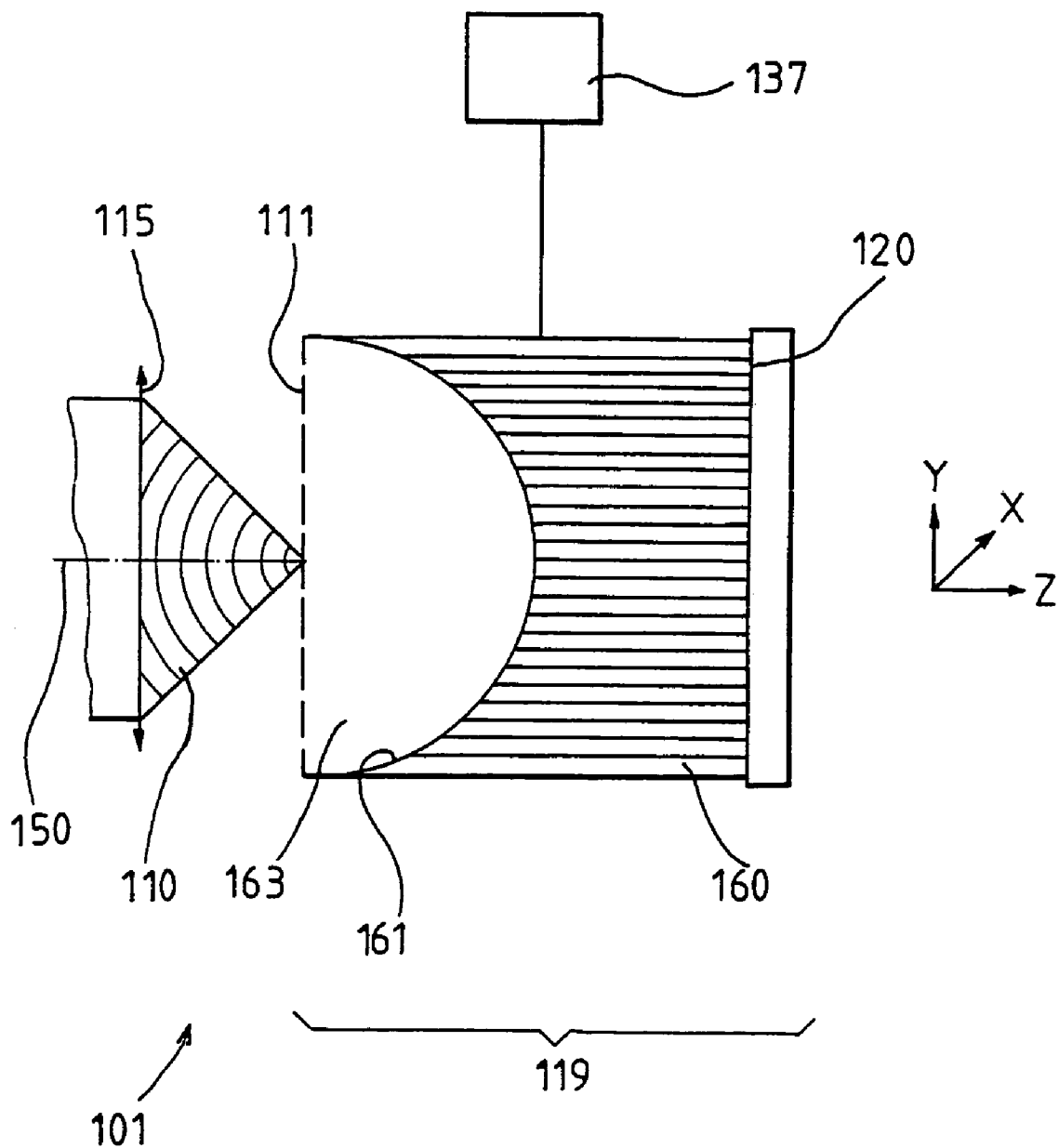
FIG. 12 is a diagram showing a further apparatus for wavefront detection according to the invention, constituted as a diffraction grating and detector unit.

A further apparatus 101 for wavefront detection is schematically shown in axial longitudinal section in FIG. 12. The elements in FIG. 12 corresponding to the elements of FIGS. 1-9 have the same reference numbers, increased by the number 100. For a description of these elements, reference is made to the description for FIGS. 1-9.

Wavefronts emergent from a wavefront source pass through an optical system of which solely the optical element 115 is shown, and are transformed by the optical system into emergent wavefronts 110 which then strike a diffraction grating 111.

The diffraction grating 111 is combined with a spatially resolving detector 119 to give a diffraction grating and detector unit 111, 119

Here an image-preserving light guide fiber bundle 160 is contacted with a radiationsensitive sensor surface 120 of the detector 119. The fiber bundle 160 ends on the diffraction grating side in a spherical fluorescence layer 161 which is concentric with the intersection point of the optical axis 150 and diffraction grating 111, the optical axis 150 again being parallel to the Z direction.

A transparent hemisphere 163 is cemented into the concave surface of the fiber bundle 160 with a fluorescent cement, with the formation of the fluorescent layer 161, the hemisphere 163 also serving for protection of the fluorescent layer 161. The diffraction grating 111 is arranged on the flat side of the hemisphere 163.

Because of the scattering effect of the fluorescent layer 161 in all directions, not only a wavelength adaptation to the spectral sensitivity of the sensor surface 120 can take place by means of the fluorescent layer 161, but also the coupling-in of the diffracted radiation into the individual light guide fibers is improved. In a case that a conversion of frequency or wavelength is not required, instead of the fluorescent layer 161 a scattering secondary radiator surface can also be attained by matting the concave surface of the fiber bundle 160.

The diffraction grating 111 is constituted as a chessboard grating or cross grating, i.e., it has a diffracting periodic structure respectively for the X direction, and for the Y direction orthogonal thereto. Phase gradients in more than one direction can thereby be determined from a single interferogram recorded by the spatially resolving detector 119. With a view to the evaluation of the interferogram, a translation module 137 is allocated for the displacement of the diffraction grating and detector unit 111, 119, and thus the diffraction grating 111, in respectively the X or Y directions. The contrast of one of the orthogonal interference systems of the diffraction grating 111 can thus be suppressed during the integration time of the radiation-sensitive sensitive sensor surface 120 by means of a movement of the diffraction grating by an integral multiple of the respective grating period.

Figure 13:
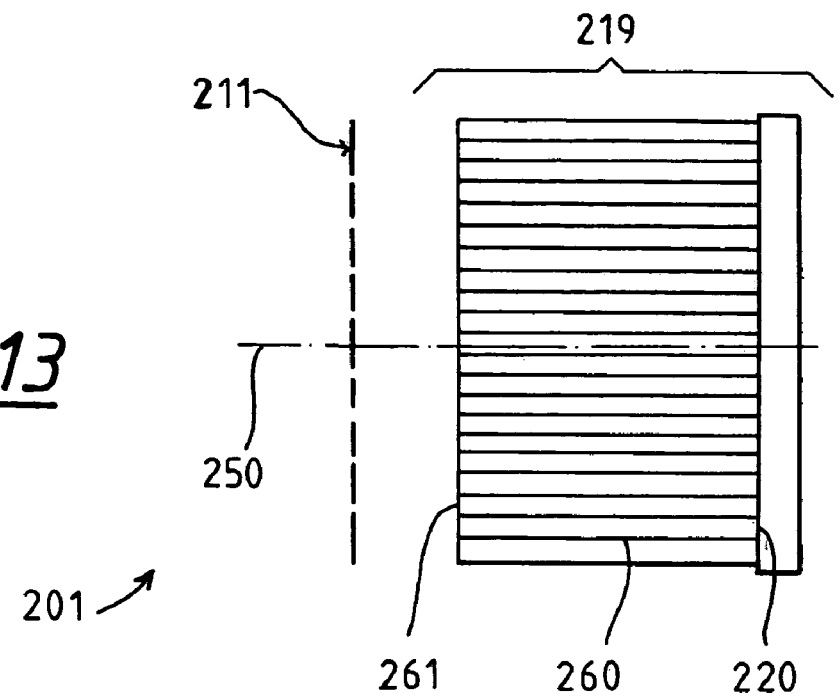
FIG. 13 is a diagram showing a third apparatus for wavefront detection according to the invention, constituted as a diffraction grating and detector unit.

A further diffraction grating 211 and detector unit can be seen in FIG. 13. The elements in FIG. 13 corresponding to the elements of FIG. 12 have the same reference numbers, increased by the number 100. For a description of these elements, reference is made to the description for FIG. 12 or for FIGS. 1-9.

In the diffraction grating and detector unit 201 of FIG. 13, the interferogram of the secondary radiator surface 261 is imaged onto the image sensor 220 by means of a light conducting fiber bundle 260 constituted as a fiber plate and contacted directly with the secondary radiator surface 261 and the image sensor 220. In this embodiment, the diffraction grating 211 can be moved separately from the detector 219, e.g. for the mentioned displacement in one of the periodicity directions of the diffraction grating 211 orthogonal to the optical axis 250. In addition, the diffraction grating 211 can also be displaced parallel to the optical axis 250, for the adjustment of the exit pupil size on the sensor surface 220. A secondary radiator surface, which may be e.g. a frequency preserving matting or a frequency converting quantum converting layer, may also be disposed on the backside of a substrate carrying the diffraction grating 211 and facing the sensor surface.

Figure 14:
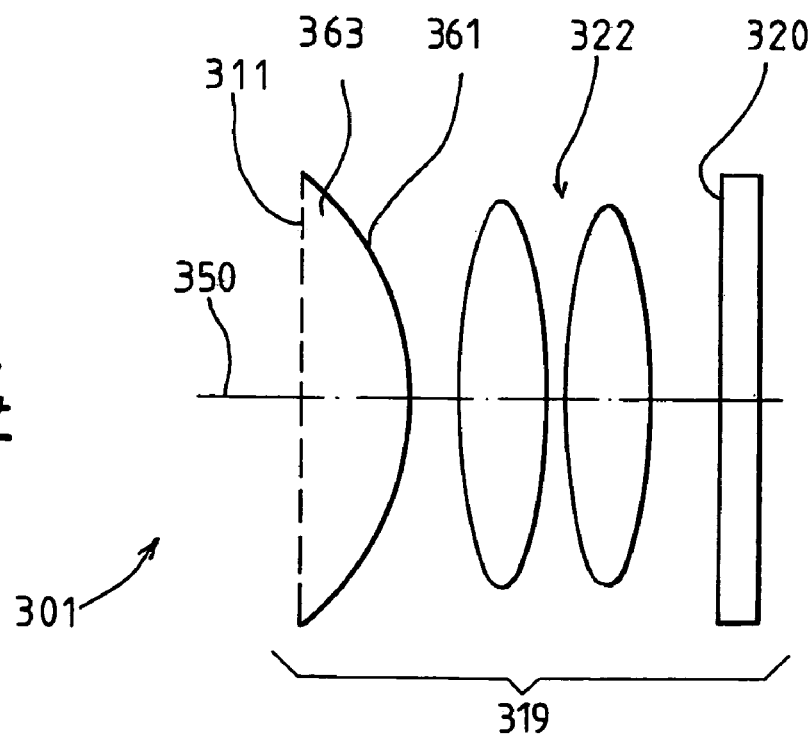
FIG. 14 is a diagram showing a fourth apparatus for wavefront detection according to the invention, constituted as a diffraction grating and detector unit.

A diffraction grating and detector unit can be seen in FIG. 14, in which the diffraction grating and the secondary radiator surface are arranged on a common diffraction grating holder. The elements in FIG. 14 corresponding to the elements of FIG. 12 have the same reference numbers, increased by the number 200 For a description of these elements, reference is made to the description for FIG. 12 or for FIGS. 1-9.

The embodiment 301 of FIG. 14 has a telecentric optical imaging system 322 which images, onto the radiation-sensitive sensor surface 320, the interferogram of the secondary radiator surface 361, which is curved toward the diffraction grating 311 and is situated on the side of the diffraction grating holder 363 remote from the diffraction grating. In other embodiments there is provided a plane-parallel diffraction grating holder provided with a planar secondary radiator surface disposed on the backside facing the sensor.

A planar secondary radiator surface could be arranged directly adjacent to the sensor surface, with omission of the imaging system 322. The diffraction grating holder could thereby serve at the same time as a cover glass for the sensor surface 320.

Figure 15:
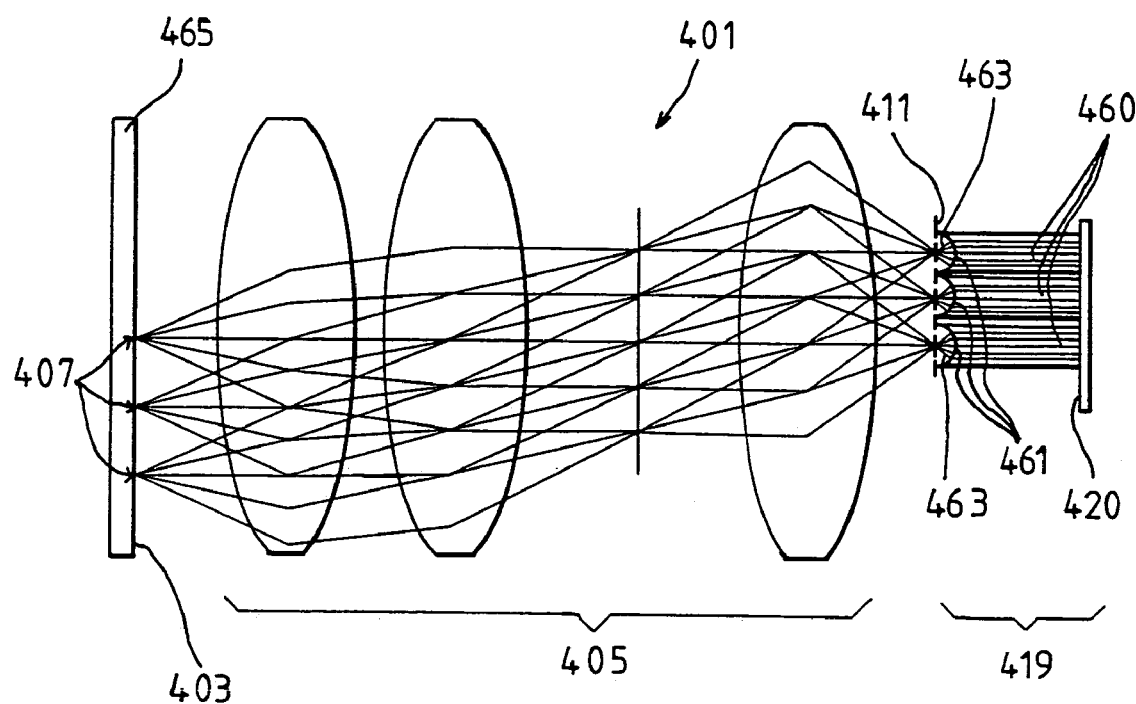
FIG. 15 is a diagram showing an embodiment with plural parallel measurement channels.
Figure 16:
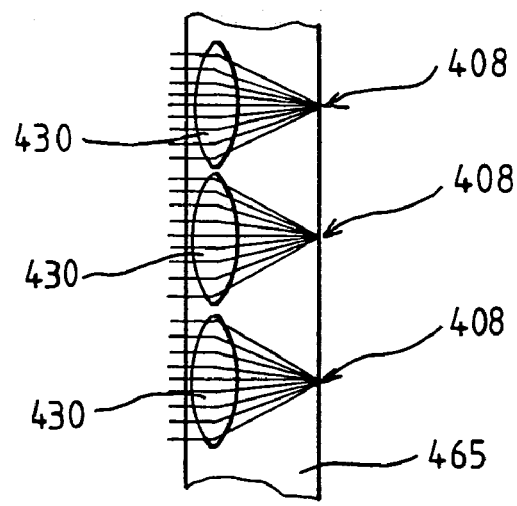
FIG. 16 is an enlarged sectional diagram of the wavefront module of the embodiment of FIG. 15.

A further embodiment of an apparatus for wavefront detection is shown in FIGS. 15 and 16. The elements in FIGS. 15 and 16 corresponding to the elements of FIGS. 1-9 or of FIG. 12 have the same reference numbers, increased by the number 400 or 300. For a description of these elements, reference is made to the description for FIGS. 1-9 or for FIG. 12.

The apparatus 401 includes a wavefront module 465, which is shown in FIG. 15 and also shown in detail as an excerpt in FIG. 16, and plural, spherical, secondary radiator surfaces 461 with light guide fiber bundles 460 respectively associated with these.

The wavefront source 407 shown as an excerpt in FIG. 16 includes a two-dimensional, e.g. hexagonal, arrangement of focusing lenses 430 and perforated masks 408 extended in the object plane of the optical system 405, with a respective one of the focusing lenses 430 concentrating illumination light incident in the direction toward the diffraction grating 411 onto the associated perforated mask 408.

Thus the wavefronts in the whole image field of the optical system 405 can be detected in parallel for a large number of field points by means of the apparatus 401 for wavefront detection, as indicated in FIG. 15 using three beam paths emergent from the wavefront source 407. The optical system 405 can thus, based on the invention, be measured in parallel, i.e., simultaneously, for plural field points, as regards their imaging properties.

The apparatus 405 is thus a multi-channel apparatus for wavefront detection, while the apparatuses of FIGS. 1-14 are single-channel in this sense. The diffraction grating and detector unit of FIG. 13 is however also suitable for the apparatus 401.

Figure 17:
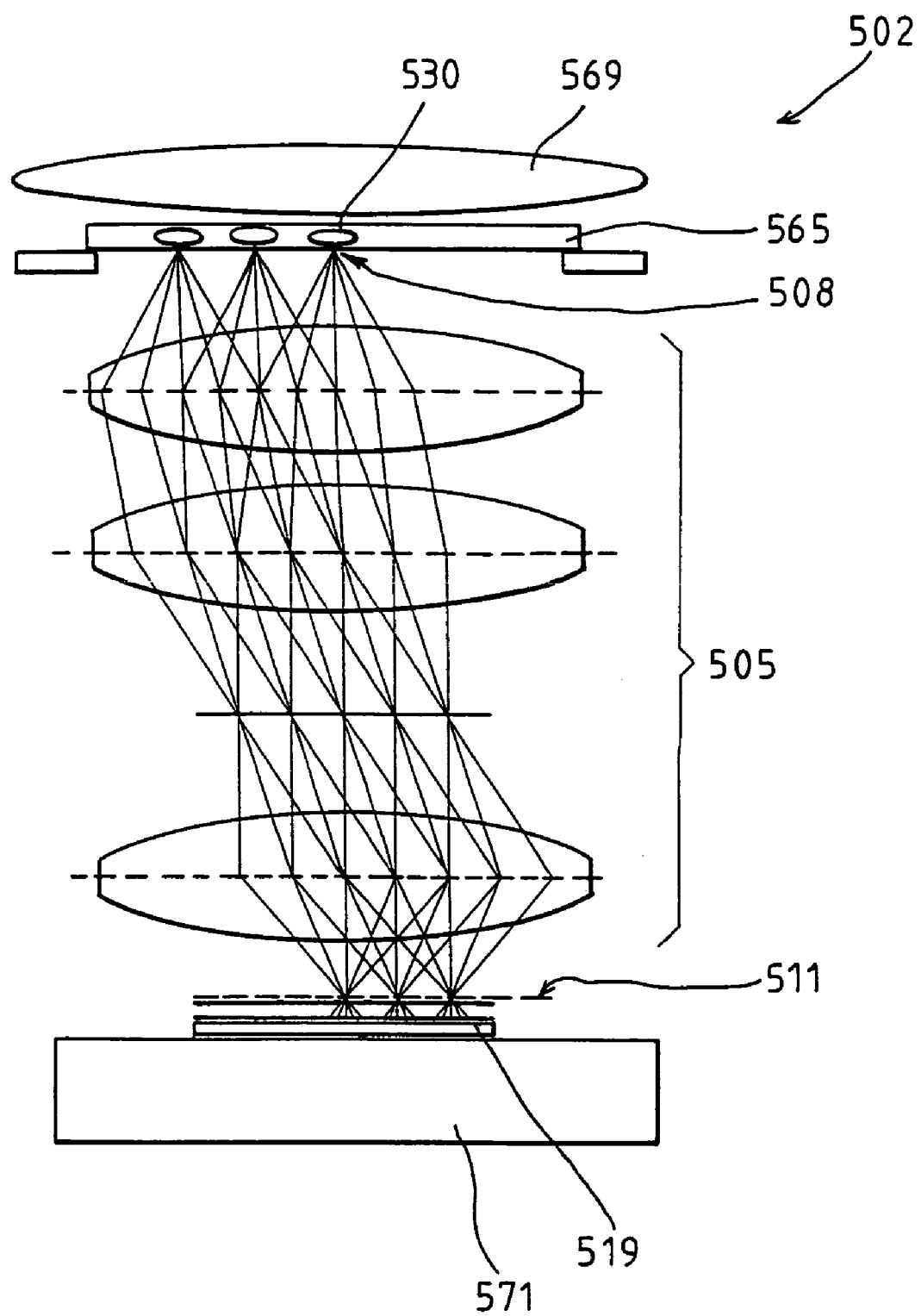
FIG. 17 is a diagram showing an arrangement for microlithography with a multi-channel apparatus for wavefront detection.

An arrangement 502 for microlithography in which a multi-channel apparatus for wavefront detection according to the invention is integrated is schematically shown in FIG. 17. The elements in FIG. 17 corresponding to the elements of FIG. 15 have the same reference numbers as in FIG. 15, increased by the number 100. For a description of these elements, reference is made to the description for FIG. 15.

The microlithography arrangement 502 is in particular a stepper or scanner, and includes a microlithography projection objective 505, into whose object plane a wavefront module 565 can be pushed in or pivoted in, in exchange for a reticle. The wavefront module 505 is supplied with illuminating irradiation by means of an illumination field lens 569. A diffraction grating and detector unit 511, 519 of the type shown in FIG. 13 is situated instead of a wafer on a wafer stage 571, and is operationally interchangeable with a wafer, the diffraction grating 511 being arranged in the image plane of the projection objective 505 The above-mentioned displacement of the diffraction grating 511 can then take place by means of the movable wafer stage 571, which is already movable orthogonally with respect to the optical axis of the projection objective 505, the whole diffraction grating and detector unit 511, 519 being moved. Since the order of magnitude of the required displacement path is typically 10 μm, the shift of the exit pupil on the sensor surface caused by this displacement is negligibly small, The diffraction grating and detector unit with regionally spherical detector shown in FIG. 15 can also preferably be used as the diffraction microlithography.

Particularly for applications at operating wavelengths of less than ca. 22 nm, e.g. for 193 nm, 157 nm, or below, it is useful to keep the region of the wavefront module or the wavefront source and/or the region of the diffraction grating-detector-unit or the diffraction grating free from oxygen and other substances such as water, hydrocarbons or the like which absorb the radiation used in the illumination process. Therefore, it is provided in some embodiments that these areas are purged or flushed with an inert gas or filled with an inert gas and sealed or evacuated. As a filling gas or purging gas a gas may be used which contains helium or nitrogen and is essentially free of oxygen. There may be provided a preferably gas tight sealable, transparent container, e.g. comprising walls of calciumfluoride or fused silica, which surrounds the arrangement to be protected and can be filled or purged with a gas which is essentially nonabsorbing for the use radiation and/or which can be evacuated.

For example, the distortion of the projection objective 505 can be measured with the stepper/scanner 502 for microlithography, based on the multi-channel feature of the wavefront module 565 and diffraction grating and detector unit 511, 519. Since the phase relationships between the individual measurement channels are fixed and known, due to the compact diffraction grating and detector unit which is combined into a single constructional unit, the relative tilting of the wavefronts and thus the distortion can namely be determined by relative phase measurements.

Figure 18:
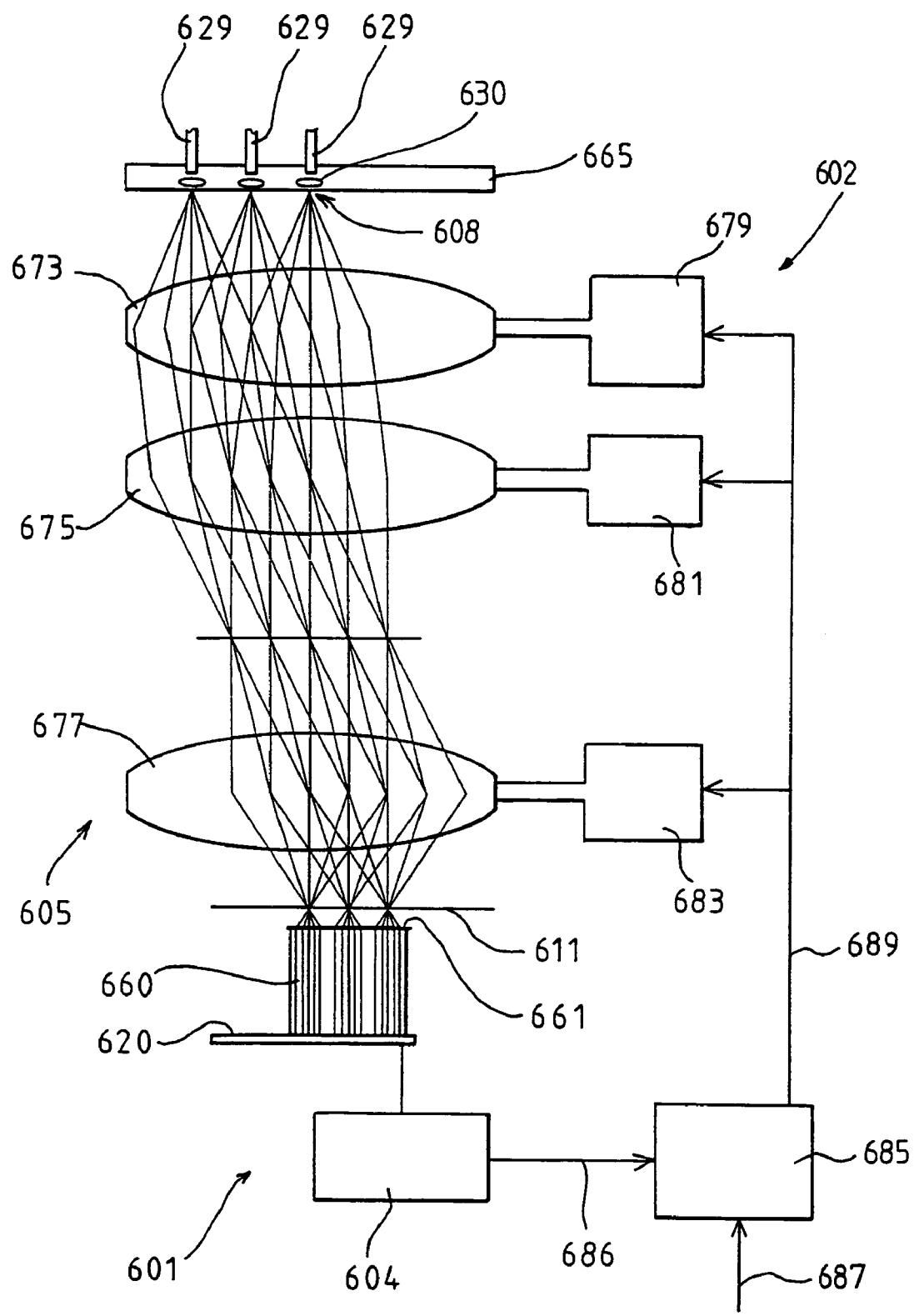
FIG. 18 is a diagram showing an arrangement according to FIG. 17, with an aberration control circuit.

An arrangement 602 for microlithography with an aberration control circuit is schematically shown in axial longitudinal section in FIG. 18. The elements in FIG. 18 corresponding to the elements of FIG. 17 have the same reference numbers, increased by the number 100. For a description of these elements, reference is made to the description for FIG. 17 or for FIGS. 1-16.

Differing from the stepper/scanner 502, the arrangement of FIG. 18 has as illumination system, plural illumination light guide fibers 629 respectively associated with a perforated mask 608. That is, this illumination arrangement corresponds to a two-dimensional array of the arrangement shown in FIG. 6.

In this matrix arrangement of illuminating fibers, the optical axis of the illumination is fixedly aligned to the main beam direction and thus a homogeneous illumination of the aperture stop from each object field point is possible.

The projection objective 605 of the microlithography arrangement 602 constituted as a stepper or scanner includes as optical elements, for example, three lenses 673, 675 and 677. An operating element 679, 681 and 683, by means of which the imaging properties of the corresponding lens and thus of the projection objective 605 are controllable, is respectively associated with the lenses 673, 675 and 677. The operating elements can, e.g., be positioning members with which the associated lens can be displaced or rotated, or actuators, with which the associated lens can be deformed in a targeted manner or subjected to mechanical stress.

An apparatus 601 for wavefront detection includes an evaluation unit 604 which determines the instantaneous wavefront topography characteristic of the imaging properties of the projection objective 605 from the interferograms recorded by a sensor surface 620.

A signal 686 corresponding to the sensed instantaneous wavefront is passed from the evaluation unit 604 to a comparator 685. The comparator 685 compares the signal 686 with a reference signal 687 corresponding to the desired imaging properties of the projection objective 605. Derived from the result of the comparison, operating signals 689 are passed to the operating elements 679, 681 and 683, and thereby act on the optical elements 673, 675, and 677 in a manner to reduce the aberrations of the projection objective 605.

In the manner of a control circuit, i.e., of a closed circuit, these steps are repeated until the signal 686 corresponds to the signal 687, that is, the projection objective 605 has the desired imaging properties.

It is however possible to operate the arrangement 602 in the manner of an aberration control, that is, an open circuit, omitting feedback loops.

It is advantageous for this purpose that the apparatus 601 can detect the wavefronts in the whole image field of the projection objective 605 in parallel for a large number of field points. The field distribution of the aberrations can be calculated therefrom. The aberration components which can be affected by the operating elements are determined from this field distribution of the aberrations, and the control variables for the operating elements are then calculated by a suitable process, e.g., on variation tables based on optical calculations for the projection objective.

We claim:

1. A microlithography arrangement comprising a projection objective and an arrangement for wavefront detection, comprising:
   a wavefront source which produces a wavefront;
   a diffraction grating following the wavefront source; and
   a spatially resolving detector following the diffraction grating;
   wherein the wavefront source has a two-dimensional structure; and
   wherein the wavefront source is configured to move between a first position in an object plane of the projection objective within the arrangement and a second position that is removed from the object plane.

2. The arrangement according to claim 1, wherein the wavefront source includes a perforated mask.

3. The arrangement according to claim 2, wherein the perforated mask has a plurality of periodically arranged openings.

4. The arrangement according to claim 3, wherein the plurality of periodically arranged openings are arranged in four fold symmetry.

5. The arrangement according to claim 3, wherein the plurality of periodically arranged openings are arranged in three fold symmetry.

6. The arrangement according to claim 1, wherein the wavefront source comprises a microlens system comprising at least one microlens plate with at least one microlens formed at the microlens plate, wherein the microlens is one of refractive and diffractive.

7. The arrangement according to claim 6, wherein the microlens system comprises a stack with at least two microlens plates arranged with mutual axial distance.

8. The arrangement according to claim 6, wherein a microlens plate of the micorlens comprises an array-arrangement with a plurality of microlenses, wherein the array-arrangement is one of one-dimensional and two-dimensional.

9. The arrangement according to claim 6, wherein a correcting device which corrects an intensity distribution of transiting radiation is integrated into the microlens system.

10. The arrangement according to claim 1, wherein the wavefront source further comprises at least one correcting device which corrects an intensity distribution of transiting radiation.

11. The arrangement according to claim 10, wherein the correcting device is variably adjustable.

12. The arrangement according to claim 10, wherein the correction of the intensity distribution effected by the correcting device is adapted to detection characteristics of the spatially resolving detector such that the detection dynamics of the spatially resolving detector are optimized.

13. The arrangement according to claim 1, wherein the diffraction grating is adjusted relative to the structure of the wavefront source so that only given orders of diffraction contribute to interference at the diffraction grating.

14. The arrangement according to claim 1, further comprising a translation module associated with the diffraction grating which displaces the diffraction grating in different periodicity directions.

15. The arrangement according to claim 1, wherein the detector includes a radiation-sensitive sensor surface and an imaging system arranged between the diffraction grating and the sensor surface.

16. The arrangement according to claim 15, wherein the imaging system is telecentric.

17. The arrangement according to claim 1, wherein the detector includes a secondary radiator surface.

18. The arrangement according to claim 1, wherein the detector includes a plurality of light guides.

19. The arrangement according to claim 1, wherein the diffraction grating is operationally brought into or removed out of an image plane of the projection objective.

20. The arrangement according to claim 1, wherein at least one of an area of the wavefront source and an area of the diffraction grating is constructed such that this area is at least one of purgeable with an inert gas or permanently enclosable by an inert gas and evacuatable, wherein the inert gas is essentially non-absorbing for used radiation.

21. The arrangement according to claim 1, wherein the detector is at least regionally spherical.

22. The arrangement according to claim 1, wherein the detector includes an at least partially curved secondary radiator surface arranged between the diffraction grating and a radiation-sensitive sensor surface.

23. The arrangement according to claim 22, wherein the secondary radiator surface is frequency changing.

24. The arrangement according to claim 22, wherein light guide ends on a diffraction grating side of the detector are connected by a frequency-changing cement to a spherical surface region of a hemisphere.

25. The arrangement according to claim 1, wherein the detector includes a plurality of light guides on a diffraction grating side of the detector with ends of the light guides on the diffraction grating side arranged on a spherical segment.

26. The arrangement according to claim 1, further comprising a diffraction grating holder that holds the diffraction grating and has a secondary radiator surface.

27. The arrangement according to claim 1, wherein the diffraction grating is arranged on a planar surface region of a hemisphere.

28. The arrangement according to claim 27, wherein a spherical surface region of the hemisphere is constituted as a secondary radiator surface.

29. The arrangement according to claim 1, wherein a plurality of wavefront sources are arranged in front of the diffraction grating.

30. The arrangement according to claim 29, wherein the detector includes a plurality of lightguides for each wavefront source.

31. The arrangement according to claim 29, wherein the detector includes a spherical secondary radiator surface for each wavefront source.

32. The arrangement according to claim 1, wherein the projection objective includes at least one optical element, and associated with the at least one optical element is an operating element with which operating element imaging properties of the at least one optical element are varied, and which operating element is controllable by the arrangement for wavefront detection.

33. The arrangement according to claim 32, wherein a comparator compares signals emitted by the apparatus for wavefront detection and corresponding properties of the projection objective, and wherein the comparator emits signals which control the operating element.

34. The arrangement according to claim 1, wherein the wavefront source is adapted to generate wavefronts having different degrees of spatial coherence.

35. An apparatus for wavefront detection, comprising:
a wavefront source which produces a wavefront, wherein the wavefront source is arranged optically upstream from a test object;
a diffraction grating following the wavefront source; and
a spatially resolving detector following the diffraction grating;
wherein the wavefront source has a two-dimensional structure having a plurality of openings that extend two-dimensionally, the two-dimensional structure being adapted such that spatial coherence of radiation exiting the wavefront source is adjusted by means of the two-dimensional structure of the wavefront source;
wherein the radiation exits the plurality of openings at a given instant in time;
wherein the wavefront source further comprises at least one correcting device which corrects an intensity distribution of transiting radiation; and
wherein the correcting device comprises at least one gray filter having a varying transmittance across its diameter arranged in a region of a pupil plane of the wavefront source.

36. An apparatus for wavefront detection, comprising:
a wavefront source which produces a wavefront, wherein the wavefront source is arranged optically upstream from a test object;
a diffraction grating following the wavefront source; and
a spatially resolving detector following the diffraction grating;
wherein the wavefront source has a two-dimensional structure having a plurality of openings that extend two-dimensionally, the two-dimensional structure being adapted such that spatial coherence of radiation exiting the wavefront source is adjusted by means of the two-dimensional structure of the wavefront source;
wherein the radiation exits the plurality of openings at a given instant in time;
wherein the wavefront source further comprises at least one correcting device which corrects an intensity distribution of transiting radiation; and
wherein the correcting device is constructed such that a spatial intensity distribution with an intensity increasing towards a periphery of an illuminated area is created.

37. An apparatus for wavefront detection, comprising:
a wavefront source which produces a wavefront, wherein the wavefront source is arranged optically upstream from a test object;
a diffraction grating following the wavefront source;
a spatially resolving detector following the diffraction grating; and
a displacement module associated with said wavefront source, the displacement module displacing the wavefront source in an object plane;
wherein the wavefront source has a two-dimensional structure having a plurality of openings that extend two-dimensionally, the two-dimensional structure being adapted such that spatial coherence of radiation exiting the wavefront source is adjusted by means of the two-dimensional structure of the wavefront source;
wherein the radiation exits the plurality of openings at a given instant in time; and wherein the displacement module displaces the detector parallel to an image plane when the wavefront source is displaced in the object plane—after "given the in time".

38. An apparatus for wavefront detection, comprising:
a wavefront source which produces a wavefront, wherein the wavefront source is arranged optically upstream from a test object;
a diffraction grating following the wavefront source;
a spatially resolving detector following the diffraction grating;
a sensor surface;
a radiation source;
a first beamsplitter which couples out a portion of radiation supplied by the wavefront source, which is arranged between the radiation source and the wavefront source; and
a second beamsplitter following the diffraction grating that deflects the portion of radiation coupled-out by the first beamsplitter to the sensor surface;
wherein the wavefront source has a two-dimensional structure having a plurality of openings that extend two-dimensionally, the two-dimensional structure being adapted such that spatial coherence of radiation exiting the wavefront source is adjusted by means of the two-dimensional structure of the wavefront source; and
wherein the radiation exits the plurality of openings at a given instant in time.

39. The apparatus according to claim 38, further comprising a reference light guide that transports the portion of radiation coupled-out by the first beamsplitter to the second beamsplitter.

40. A process for wavefront detection, comprising:
producing a wavefront by a wavefront source;
producing an interferogram with the wavefront and with a diffraction grating having a diffracting periodic structure respectively in different periodicity directions; and
displacing the wavefront source or the diffraction grating by a fraction of the corresponding grating period, and detecting the resulting interferogram;

repeating the displacing step; and averaging the interferograms detected in the individual displacing and repeating steps for the wavefront detection;

wherein the different periodicity directions define a two-dimensional area; and wherein the displacing step comprises displacing the wavefront source or the diffraction grating in a direction defined by vectorial superposition of the different periodicity directions.

41. An apparatus for wavefront detection, comprising:
a wavefront source which produces a wavefront;
a diffraction grating following the wavefront source; and
a spatially resolving detector following the diffraction grating;
wherein the wavefront source has a two-dimensional structure adapted such that spatial coherence of radiation exiting the wavefront source can be adjusted by the two-dimensional structure of the wavefront source;
wherein the wavefront source comprises at least one correcting device which corrects an intensity distribution of transiting radiation;
wherein the correcting device comprises at least one gray filter arranged in a region of a pupil plane of the wavefront source; and
wherein the correcting device has a transmission which varies spatially.

42. An arrangement for wavefront detection, comprising:
a wavefront source which produces a wavefront;
a diffraction grating following the wavefront source; and
a spatially resolving detector following the diffraction grating;
wherein the wavefront source has a two-dimensional structure adapted such that spatial coherence of radiation exiting the wavefront source is adjusted by the two-dimensional structure of the wavefront source;
wherein the wavefront source comprises at least one correcting device which corrects an intensity distribution of transiting radiation; and
wherein the correcting device is constructed such that a spatial intensity distribution with an intensity increasing towards a periphery of an illuminated area is created.

43. An apparatus for wavefront detection, comprising:
a wavefront source which produces a wavefront;
a diffraction grating following the wavefront source; and
a spatially resolving detector following the diffraction grating;
wherein the wavefront source has a two-dimensional structure adapted such that spatial coherence of radiation exiting the wavefront source is adjusted by the two-dimensional structure of the wavefront source;
further comprising a displacement module associated with the wavefront source, the displacement module displacing the wavefront source in an object plane during a measurement;
wherein the displacement module displaces the detector parallel to an image plane when the wavefront source is displaced in the object plane.

44. An apparatus for wavefront detection, comprising:
a wavefront source which produces a wavefront;
a diffraction grating following the wavefront source; and
a spatially resolving detector following the diffraction grating;
wherein the wavefront source has a two-dimensional structure adapted such that spatial coherence of radiation exiting the wavefront source is adjusted by the two-dimensional structure of the wavefront source;
further comprising:
a sensor surface;
a radiation source;
a first beamsplitter which couples out a portion of radiation supplied by the wavefront source arranged between the radiation source and the wavefront source; and
a second beamsplitter following the diffraction grating that deflects the portion of radiation coupled-out by the first beamsplitter to the sensor surface;
wherein constancy of the radiation exiting the wavefront source is monitored using the portion of radiation coupled out by the first beamsplitter.

45. The apparatus according to claim 44, further comprising a reference light guide that transports the portion of radiation coupled-out by the first beamsplitter to the second beamsplitter.

46. An apparatus for wavefront detection, comprising:
a wavefront source which produces a wavefront;
a diffraction grating following the wavefront source; and
a spatially resolving detector following the diffraction grating;
wherein the wavefront source has a two-dimensional structure adapted such that spatial coherence of radiation exiting the wavefront source is adjusted by the two-dimensional structure of the wavefront source;
wherein the wavefront source comprises at least one correcting device which corrects an intensity distribution of transiting radiation in a manner spatially varying within the intensity distribution;
wherein the correction of the intensity distribution effected by the correcting device is determined based on detection characteristics of the spatially resolving detector such that detection dynamics of the spatially resolving detector are optimized;
wherein the spatially resolving detector has a planar sensor surface; and
wherein the correcting device corrects the intensity distribution of transiting radiation such that a relatively lower illumination intensity is obtained in a central region of an illuminated area as compared to a peripheral region of the illuminated area.

47. The apparatus according to claim 1, further comprising an optical system transforming the wavefront arranged between the wavefront source and the diffraction grating, wherein the wavefront source is situated in an object plane of the optical system, and the diffraction grating is situated in an image plane of the optical system conjugate to the object plane.

* * * * *

UNITED STATES PATENT AND TRADEMARK OFFICE
CERTIFICATE OF CORRECTION

| | |
|---|---|
| PATENT NO. | : 7,333,216 B2 |
| APPLICATION NO. | : 09/792607 |
| DATED | : February 19, 2008 |
| INVENTOR(S) | : Wegmann et al. |

It is certified that error appears in the above-identified patent and that said Letters Patent is hereby corrected as shown below:

Title Page, Item (75) Inventor is corrected to read:
-- Ulrich Wegmann, Konigsbronn (DE);
Helmut Haidner, Aalen (DE);
Martin Schriever, Aalen (DE);
Klaus Freischlad, Tucson (AZ) --.

Signed and Sealed this
Sixth Day of October, 2015

Michelle K. Lee
*Director of the United States Patent and Trademark Office*